United States Patent
Liu et al.

(10) Patent No.: US 9,859,423 B2
(45) Date of Patent: Jan. 2, 2018

(54) HETERO-CHANNEL FINFET

(71) Applicants: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

(72) Inventors: Qing Liu, Watervliet, NY (US); Ruilong Xie, Schenectady, NY (US); Chun-chen Yeh, Clifton Park, NY (US); Xiuyu Cai, Niskayuna, NY (US)

(73) Assignees: STMicroelectronics, Inc., Coppell, TX (US); Globalfoundries Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/587,655

(22) Filed: Dec. 31, 2014

(65) Prior Publication Data

US 2016/0190317 A1   Jun. 30, 2016

(51) Int. Cl.
- *H01L 29/165* (2006.01)
- *H01L 29/78* (2006.01)
- *H01L 29/66* (2006.01)
- *H01L 29/417* (2006.01)

(52) U.S. Cl.
CPC .... *H01L 29/7848* (2013.01); *H01L 29/41783* (2013.01); *H01L 29/6681* (2013.01); *H01L 29/7842* (2013.01); *H01L 29/7851* (2013.01); *H01L 29/165* (2013.01)

(58) Field of Classification Search
CPC ....... H01L 33/62; H01L 33/60; H01L 33/005; H01L 2933/0066; H01L 29/785; H01L 29/165; H01L 29/7848; H01L 2029/7858
See application file for complete search history.

(56) References Cited

U.S. PATENT DOCUMENTS

| | | | | |
|---|---|---|---|---|
| 2008/0003725 A1* | 1/2008 | Orlowski | .......... | H01L 29/66818 438/149 |
| 2008/0121937 A1* | 5/2008 | Adam | .................. | H01L 29/7378 257/197 |
| 2008/0296692 A1* | 12/2008 | Griebenow | ....... | H01L 21/26506 257/368 |
| 2011/0049613 A1* | 3/2011 | Yeh | ................... | H01L 29/66795 257/327 |

(Continued)

*Primary Examiner* — Daniel Luke
*Assistant Examiner* — Khatib Rahman
(74) *Attorney, Agent, or Firm* — Seed IP Law Group LLP

(57) ABSTRACT

A hetero-channel FinFET device provides enhanced switching performance over a FinFET device having a silicon channel, and is easier to integrate into a fabrication process than is a FinFET device having a germanium channel. A FinFET device featuring the heterogeneous Si/SiGe channel includes a fin having a central region made of silicon and sidewall regions made of SiGe. A hetero-channel pFET device in particular has higher carrier mobility and less gate-induced drain leakage current than either a silicon device or a SiGe device. The hetero-channel FinFET permits the SiGe portion of the channel to have a Ge concentration in the range of about 25-40% and permits the fin height to exceed 40 nm while remaining stable.

21 Claims, 12 Drawing Sheets

(56) References Cited

U.S. PATENT DOCUMENTS

| | | | |
|---|---|---|---|
| 2011/0254090 A1* | 10/2011 | Cheng | H01L 29/78654 257/347 |
| 2013/0023092 A1* | 1/2013 | Oda | H01L 21/02488 438/157 |
| 2013/0207166 A1* | 8/2013 | Chen | H01L 21/02532 257/288 |
| 2014/0175554 A1 | 6/2014 | Loubet et al. | |
| 2014/0312393 A1* | 10/2014 | Rodder | H01L 29/66537 257/288 |
| 2015/0228782 A1* | 8/2015 | Lin | H01L 29/785 257/24 |

* cited by examiner

HETERO-CHANNEL FINFET

BACKGROUND

Technical Field

The present disclosure generally relates to strained channel FinFET devices and, in particular, to a strained channel FinFET in which the channel incorporates two different semiconductor materials.

Description of the Related Art

Strained silicon transistors have been developed to increase mobility of charge carriers, i.e., electrons or holes, passing through a semiconductor lattice. Introducing tensile stress into an n-FET transistor tends to increase electron mobility in the channel region, resulting in a faster switching response to changes in voltage applied to the transistor gate. Likewise, introducing compressive stress into a p-FET transistor tends to increase hole mobility in the channel region, resulting in a faster switching response. Various methods can be used to introduce tensile or compressive stress into transistors, for both planar devices and FinFETs.

One way to introduce strain is to replace bulk silicon from the source and drain regions of the substrate, or from the channel itself, with silicon compounds such as silicon germanium (SiGe), for example. Because germanium-silicon bonds are longer than silicon-silicon bonds, there is more open space in a SiGe lattice. The presence of germanium atoms having longer bonds stretches the lattice, causing internal strain. Electrons can move more freely through a lattice that contains elongated Ge—Ge bonds, than through a lattice that contains shorter Si—Si bonds. Replacing silicon atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal.

Strain and mobility effects, thus, can be tuned by controlling the elemental composition within the epitaxially grown crystal. For example, it has been determined that epitaxial SiGe films containing a high concentration of germanium, e.g., in the range of 25%-55%, provide enhanced hole mobility compared with lower concentration SiGe films. Thus, it is advantageous to increase the percent concentration of germanium atoms in the fins in a FinFET. However, the lattice structures of high germanium concentration films tend to be mechanically unstable, especially if they contain a high number of dislocation type defects.

BRIEF SUMMARY

A hetero-channel FinFET device provides enhanced switching performance over a FinFET device having a silicon-only channel. The hetero-channel FinFET device is easier to integrate into a fabrication process than a FinFET device having a germanium-only channel. The hetero-channel FinFET device features a channel that includes two different materials, e.g., a Si/SiGe channel that includes a fin having a central region made of silicon and sidewall regions made of SiGe. A hetero-channel pFET device in particular has higher carrier mobility and less gate-induced drain leakage current than either a silicon device or a SiGe device. The hetero-channel FinFET permits the SiGe portion of the channel to have a Ge concentration in the range of about 25-55% and permits the fin height to exceed 40 nm while remaining stable.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1A:
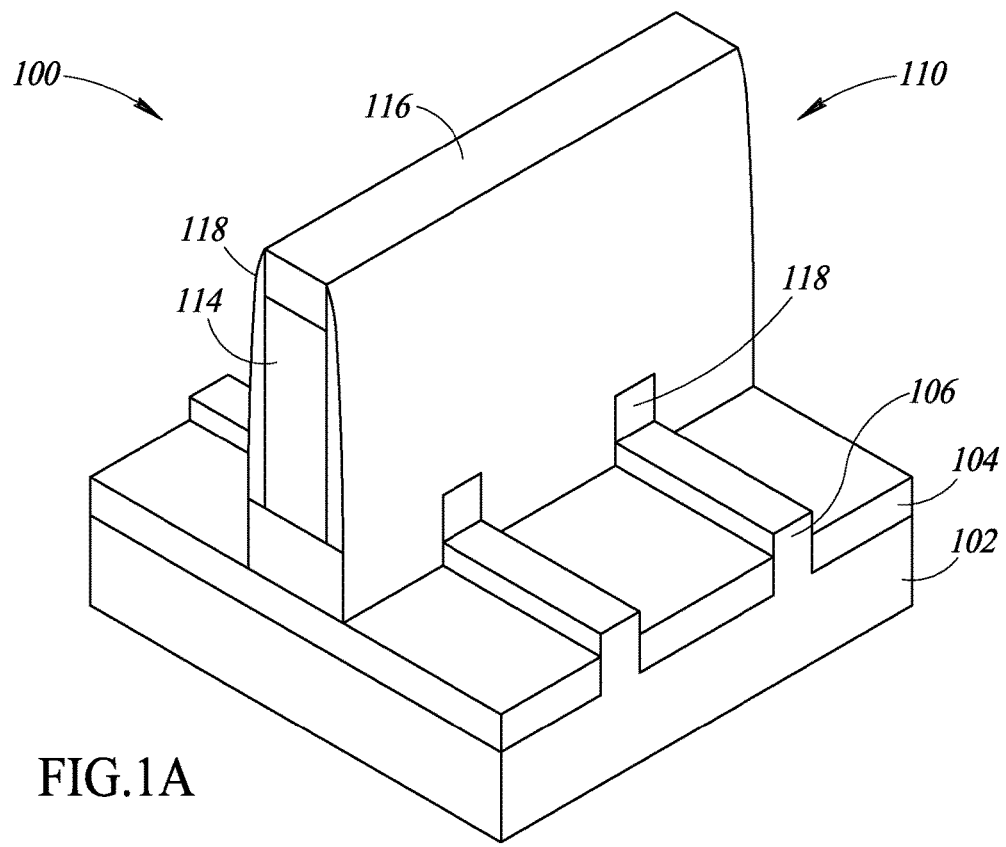
FIG. 1A is a perspective view of a hetero-channel FinFET, according to one exemplary embodiment described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to hetero-channel devices that have been produced; however, the present disclosure and the reference to certain materials, dimensions, and the details and ordering of processing steps are exemplary and should not be limited to those shown.

Turning now to the figures, FIG. 1A shows a perspective view of a hetero-channel FinFET 100 according to one embodiment described herein. The hetero-channel FinFET 100 is formed on a silicon substrate 102. Parts of the hetero-channel FinFET 100 include a fin 106 (two shown) and a gate structure 110. Adjacent fins 106 are insulated from one another by an isolation region 104. The gate structure 110 includes a gate oxide 112, a gate 114, a cap 116, and sidewall spacers 118. The fin extends out from the substrate 102. Portions of the fins 106 underlying the gate structure 110 serve as the current-carrying channels for the transistors. Portions of the fin 106 outside the gate structure 110 form raised source and drain regions that act as charge reservoirs for the hetero-channel FinFET 100. The gate structure 110 wraps around, and is in contact with, three sides of each fin 106 to control current flow in the channel regions.

Figure 1B:
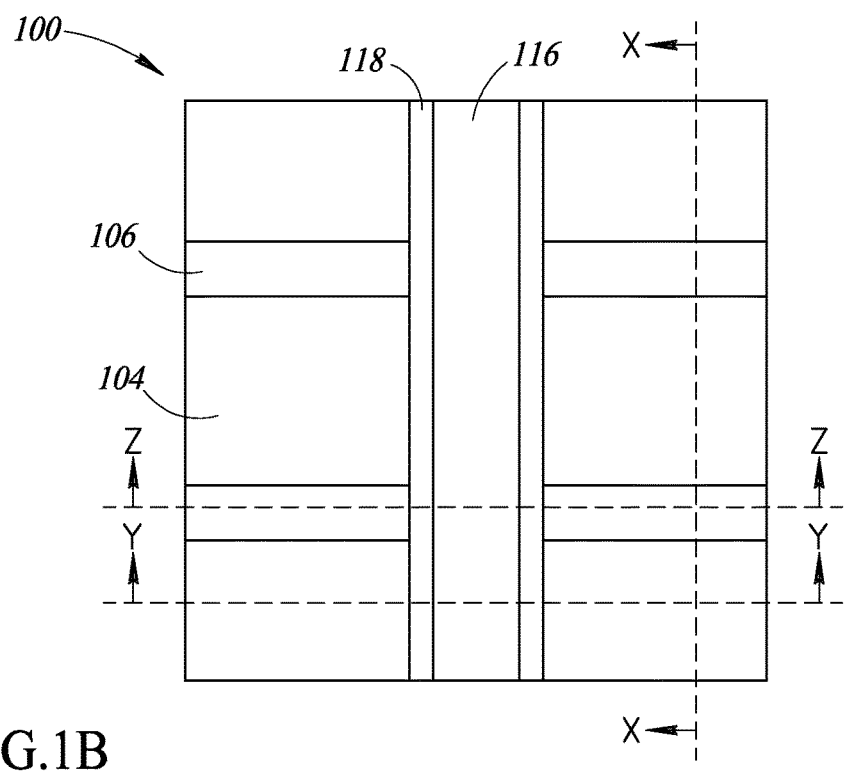
FIG. 1B is a top plan view of the hetero-channel FinFET shown in FIG. 1A, indicating cut lines used for cross-sectional views shown herein.

FIG. 1B shows a top plan view for use as a reference in interpreting views of the hetero-channel FinFET 100 shown in FIGS. 3A-7D and described below. Three cut lines are defined in FIG. 1B for cross-sectional views of the hetero-channel FinFETs shown herein. The cut line X-X provides a cross-sectional view of a plurality of fins 106; the cut line Y-Y provides a cross sectional view of the metal gate structure 110; and the cut line Z-Z provides a cross-sectional view of the hetero-channel FinFET 100, including the source, drain, channel, and gate, in the direction along the fin 106.

Figure 2:
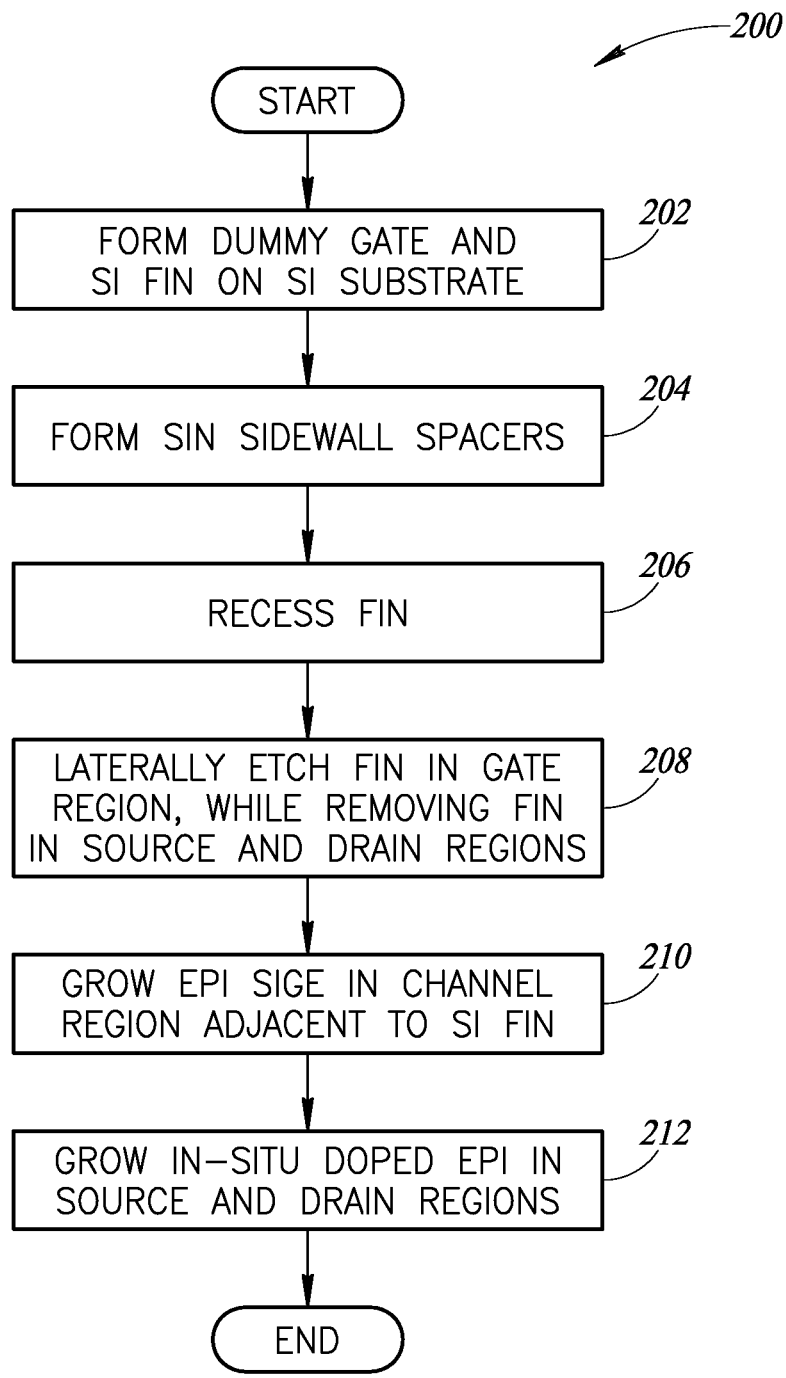
FIG. 2 is a flow diagram summarizing a sequence of processing steps that can be used to fabricate hetero-channel FinFET devices according to one exemplary embodiment described herein.

FIG. 2 shows an exemplary sequence of steps in a method 200 of fabricating a hetero-channel FinFET 100, according to one embodiment. The process shown and described may make use of techniques for nanoscale fin formation, e.g., a self-aligned sidewall image transfer (SIT) process, and gate formation, e.g., a replacement metal gate process, which techniques are known and therefore are not explained herein in detail.

The steps 202-212 in the method 200 for fabricating hetero-channel FinFETs 100 are described further below, with reference to FIGS. 3A-7D. In each set of FIGS. A-D, A is a perspective plan view of the FinFET; B is a cross-sectional view at a cut line X-X across the source/drain region of the FinFET; C is a cross-sectional view at a cut line Y-Y through the gate region of the FinFET; and D is a cross-sectional view at a cut line Z-Z through the source, drain, and channel regions of the FinFET. In accordance with convention, arrows on each cut line represent the direction of an observer's eye looking at the corresponding cut plane.

Figure 3A:
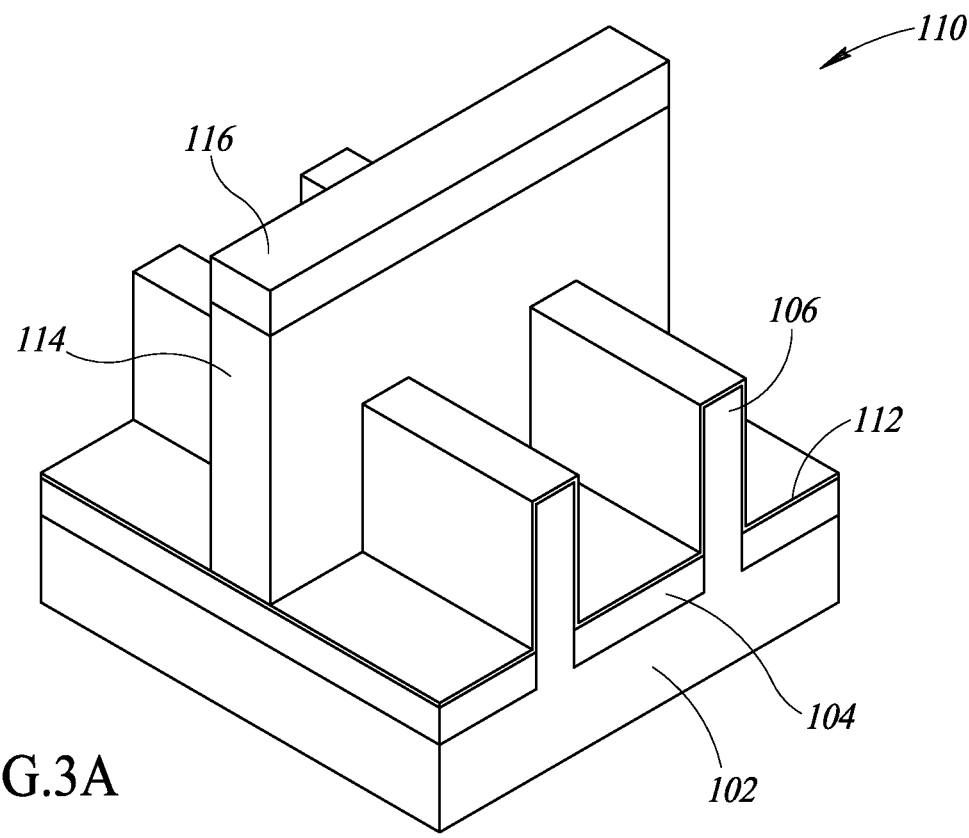
FIG. 3A is perspective plan view of a hetero-channel FinFET after forming fins and a polysilicon dummy gate.
Figure 3B:
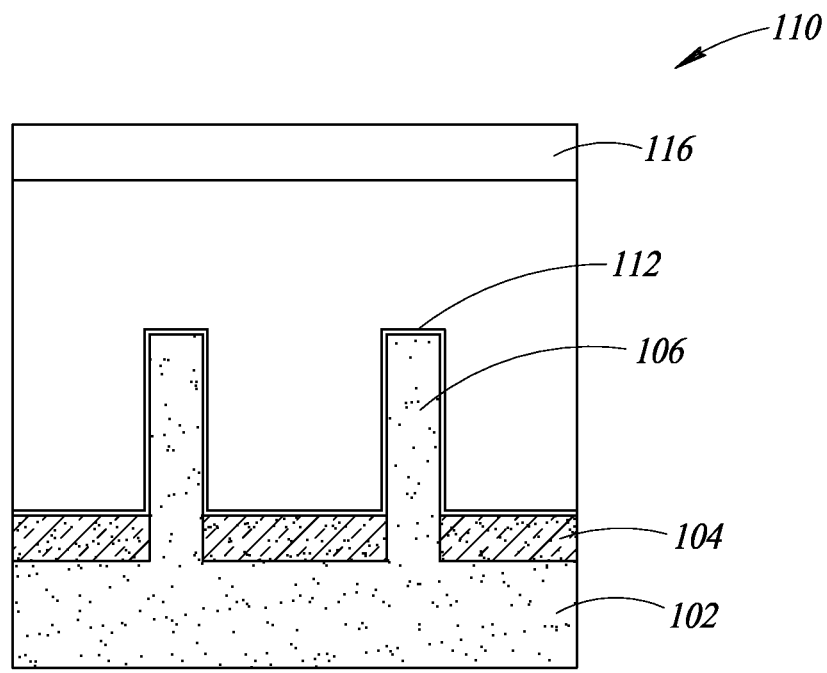
FIG. 3B is a cross-sectional view along a cut line X-X across the source/drain region of the hetero-channel FinFET of the hetero-channel FinFET shown in FIG. 3A.
Figure 3C:
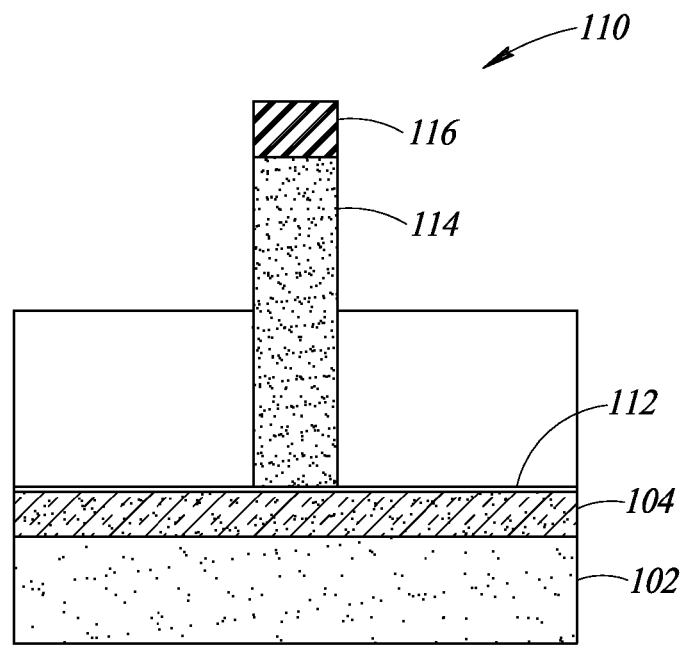
FIG. 3C is a cross-sectional view along a cut line Y-Y through the gate region of the hetero-channel FinFET shown in FIG. 3A.
Figure 3D:
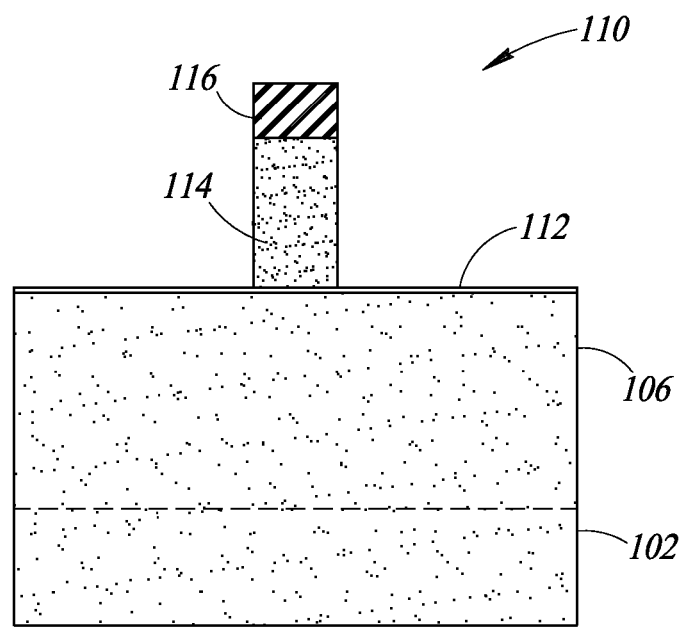
FIG. 3D is a cross-sectional view along a cut line Z-Z through the source, drain, and channel regions of the hetero-channel FinFET shown in FIG. 3A.
Figure 4A:
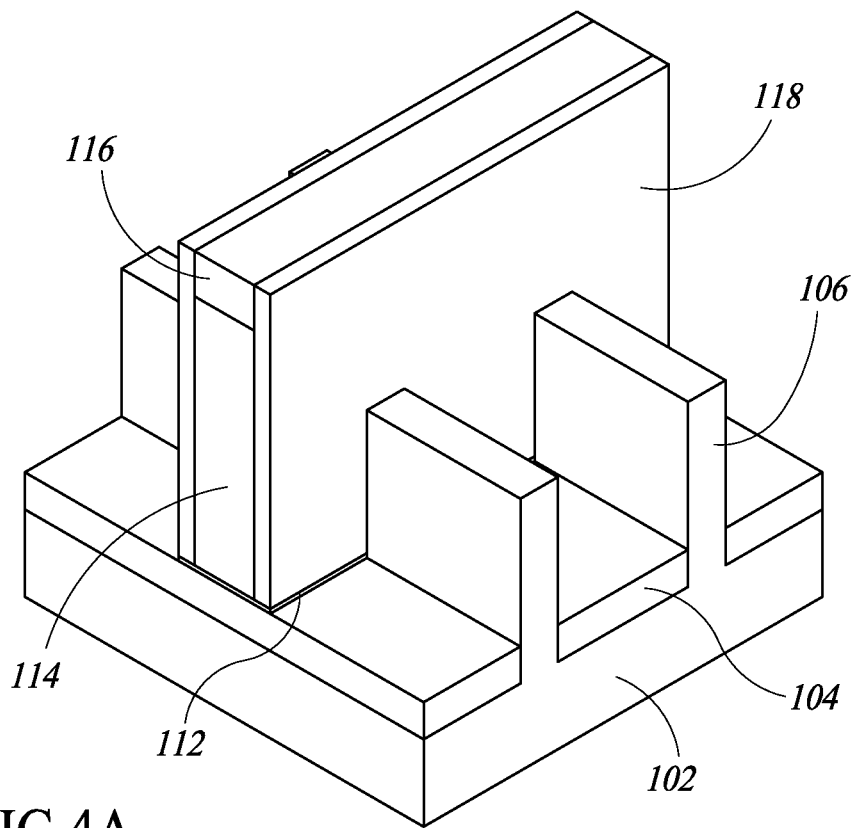
FIG. 4A is perspective plan view of a hetero-channel FinFET after forming silicon nitride sidewall spacers on the dummy gate.
Figure 4B:
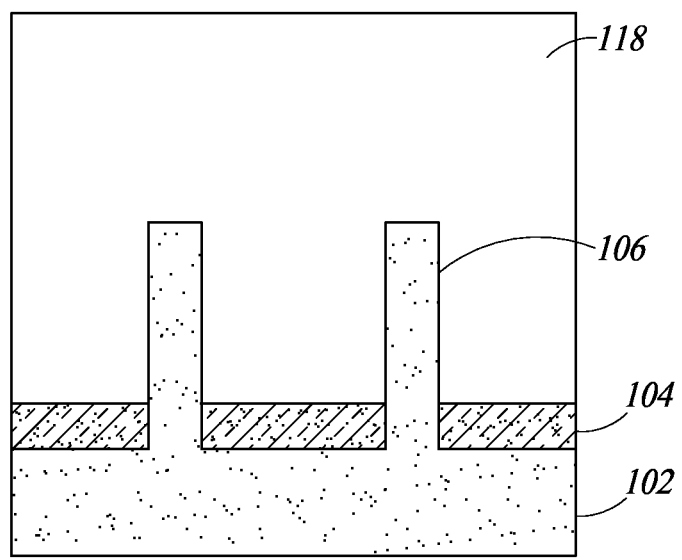
FIG. 4B is a cross-sectional view along a cut line X-X across the source/drain region of the hetero-channel FinFET of the hetero-channel FinFET shown in FIG. 4A.
Figure 4C:
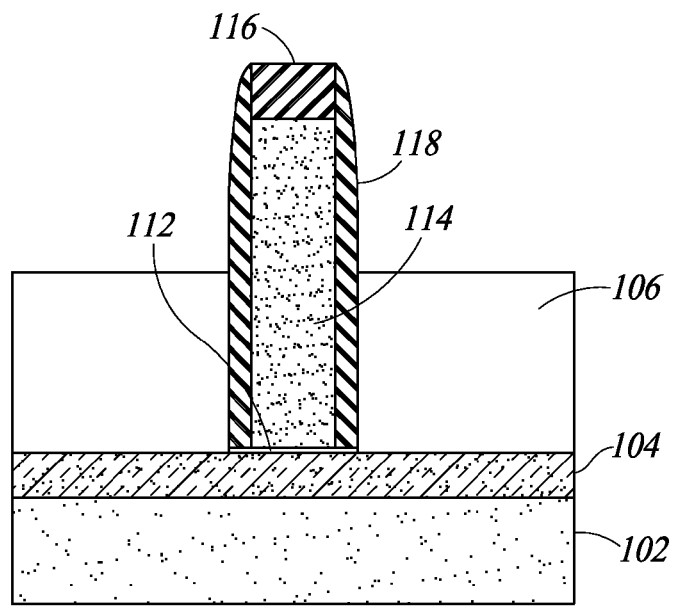
FIG. 4C is a cross-sectional view along a cut line Y-Y through the gate region of the hetero-channel FinFET shown in FIG. 4A.
Figure 4D:
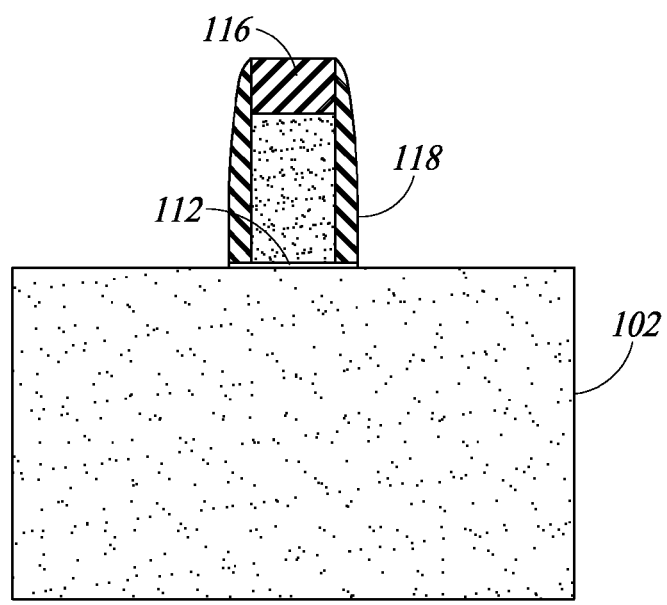
FIG. 4D is a cross-sectional view along a cut line Z-Z through the source, drain, and channel regions of the hetero-channel FinFET shown in FIG. 4A.

At 202, the fin 106 and a dummy gate structure 110 are formed on the silicon substrate 102. FIGS. 3A-3D illustrate formation of fins 106 and a dummy gate structure 110 on the silicon substrate 102, according to one embodiment. First, the fins 106 are formed in the silicon substrate 102 using, for example, a sidewall image transfer (SIT) process as described in greater detail in U.S. Patent Application Publication No. US2014/0175554, assigned to the same assignee as the present patent application. The sidewall image transfer process is capable of defining very high aspect ratio fins 106 using silicon nitride (SiN) sidewall spacers as a hard mask, instead of patterning the fins in the usual way with a photolithography mask. According to the sidewall image transfer technique, a mandrel, or temporary structure, is formed first, and then silicon nitride is deposited conformally over the mandrel and planarized to form sidewall spacers on the sides of the mandrel. Then the mandrel is removed, leaving behind a pair of narrow sidewall spacers that serve as a mask to create a pair of silicon fins 106. The resulting fins 106 are shown in FIGS. 3A, 3B, and 3D. The fins 106 are not shown in the cross-sectional view shown in FIG. 3C.

Following formation of the fins 106, the isolation region 104, e.g., an oxide material, is formed and then planarized, stopping on the SiN hard mask that remains on top of the fins 106. The SiN hard mask is then removed using a selective dry etch process or a wet etch that employs hot phosphoric acid, as is well known in the art. The fins are revealed using, e.g., an HF dip to etch back the local oxide 104 such that the fins 106 extend above the local oxide 104 by about 30-50 nm. Next, a thin layer of gate oxide 112 is conformally deposited on top of the local oxide 104, to cover the fins 106. The gate oxide 112 is desirably 3-5 nm thick.

Once the fins are patterned, a dummy gate structure 110 is formed as part of a replacement metal gate (RMG) process. The RMG process, in which the sacrificial dummy polysilicon gate structure 110 is replaced with a permanent metal gate structure, is described in greater detail in U.S. Patent Application Publication No. US2014/0175554, assigned to the same assignee as the present patent application. First, a layer of polysilicon is deposited and patterned using a silicon nitride (SiN) hard mask cap 116, to form a 50-100 nm tall sacrificial gate 114. The width of the gate 114 is in the range of 15-25 nm, desirably about 20 nm. The hard mask cap 116 used to pattern the dummy gate 114 is in the range of 20-50 nm thick. The dummy gate 114 is shown in FIGS. 3A, 3C, and 3D, and in the background of FIG. 3B.

At 204, the sidewall spacers 118 are formed, as illustrated in FIGS. 4A-4D, according to one embodiment. SiN sidewall spacers 118 are formed on the sides of the dummy gate 114 by atomic layer deposition (ALD). The ALD process deposits SiN conformally over the dummy gate 114, and also over the fins 106. Following deposition, the SiN is etched anisotropically in the usual way using an RIE process to remove SiN on the horizontal surfaces while leaving SiN on the sidewalls of the dummy gate 114. Etching the sidewall spacers 118 also removes the exposed gate oxide 112 from the fins 106 and from the local oxide 104 outside the gate structure 110. Erosion of a small surface layer of the local oxide during removal of the exposed gate oxide 112 is permitted. Removal of residual portions of the exposed gate oxide 112 can occur during a subsequent pre-epitaxial wet etch step that includes hydrofluoric acid and SiCoNi or COR, a dry chemical oxide removal process. The gate oxide 112 that remains underneath the dummy gate 114 and the sidewall spacers 118 will serve as the gate dielectric between the gate and the fins 106. Next, over-etching the SiN with a chemistry having high selectivity to silicon removes the SiN from the fins. The SiN sidewall spacer thickness is desirably in the range of about 6-12 nm.

Figure 5A:
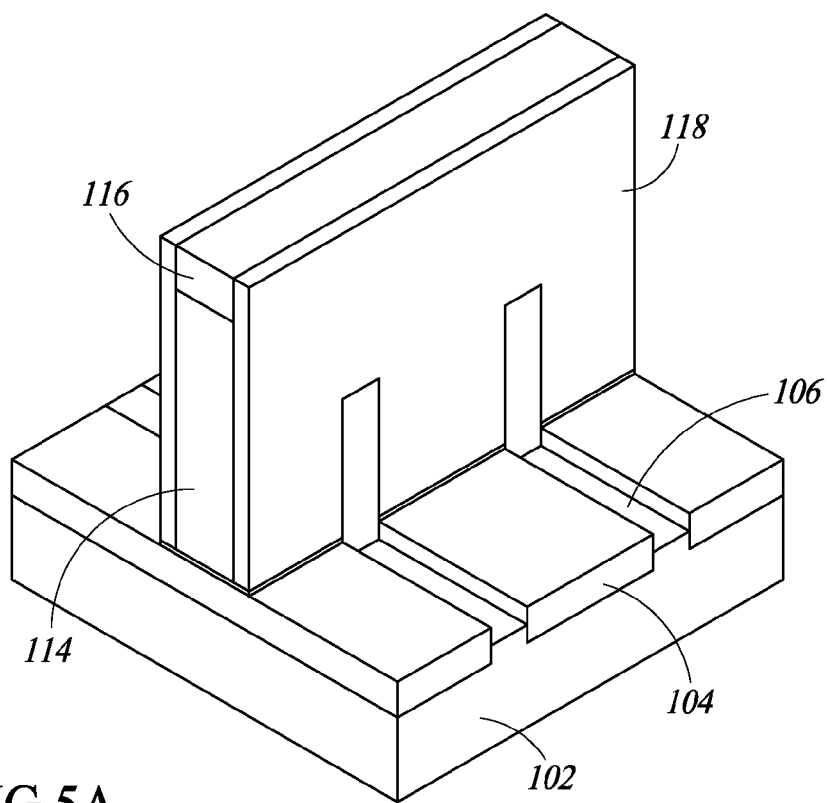
FIG. 5A is perspective plan view of a hetero-channel FinFET after partially recessing the fins.
Figure 5B:
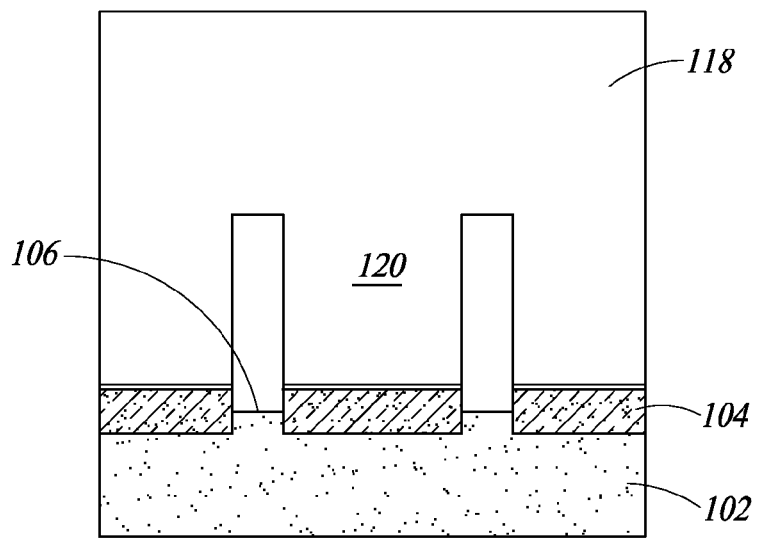
FIG. 5B is a cross-sectional view along a cut line X-X across the source/drain region of the hetero-channel FinFET of the hetero-channel FinFET shown in FIG. 5A.
Figure 5C:
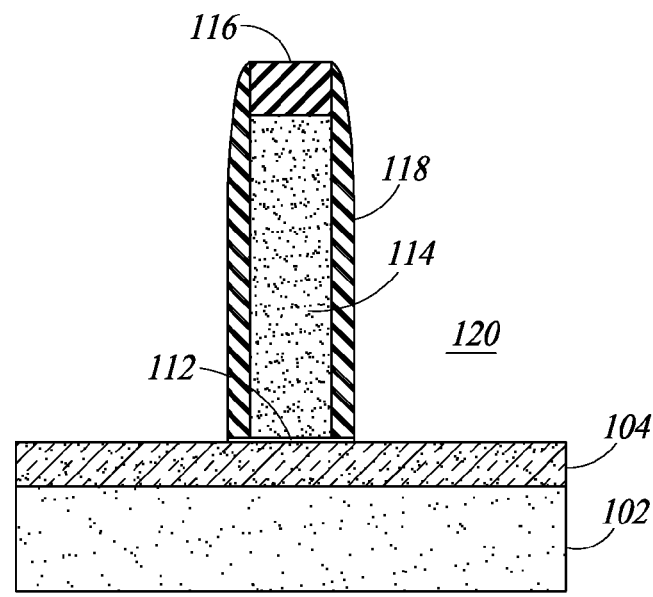
FIG. 5C is a cross-sectional view along a cut line Y-Y through the gate region of the hetero-channel FinFET shown in FIG. 5A.
Figure 5D:
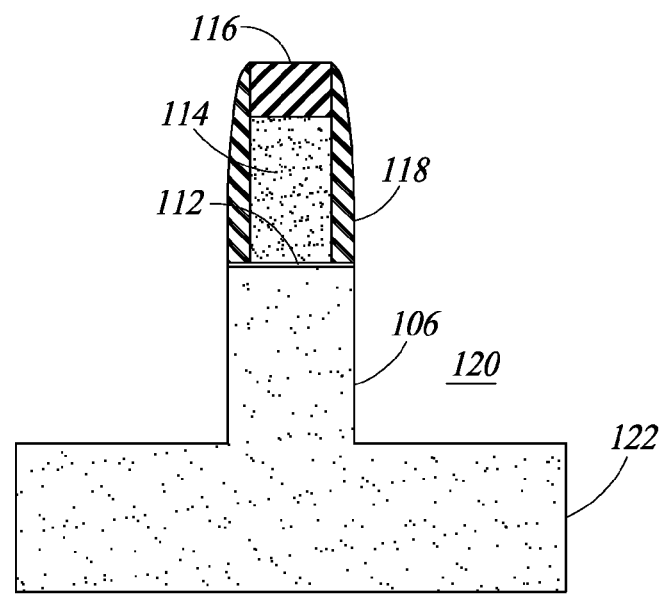
FIG. 5D is a cross-sectional view along a cut line Z-Z through the source, drain, and channel regions of the hetero-channel FinFET shown in FIG. 5A.
Figure 6A:
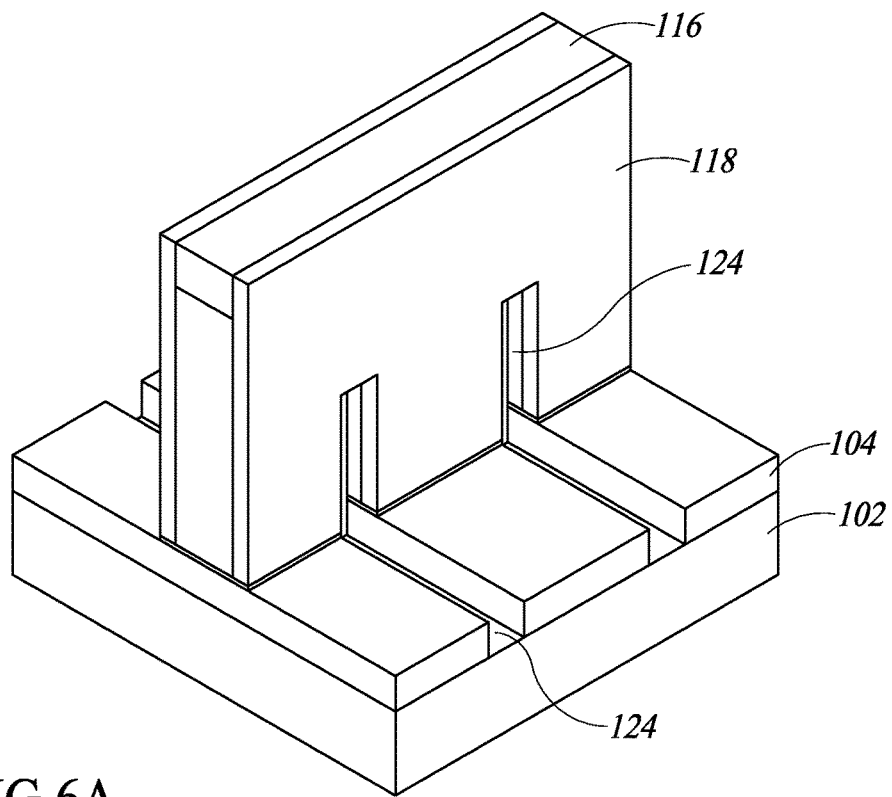
FIG. 6A is perspective plan view of a hetero-channel FinFET after fully recessing the fins.
Figure 6B:
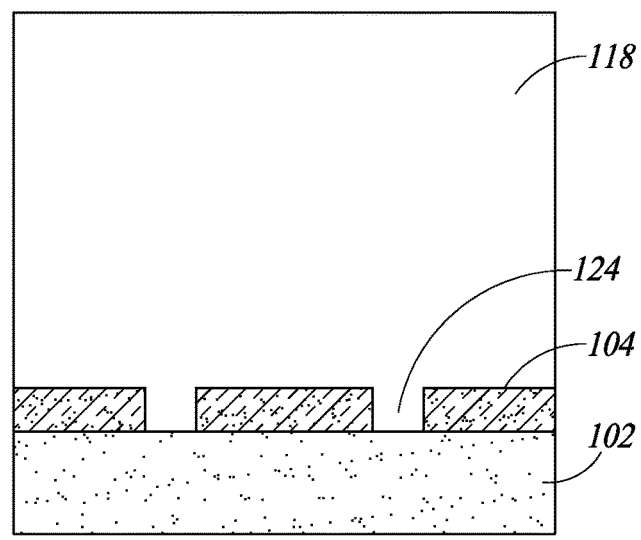
FIG. 6B is a cross-sectional view along a cut line X-X across the source/drain region of the hetero-channel FinFET of the hetero-channel FinFET shown in FIG. 6A.
Figure 6C:
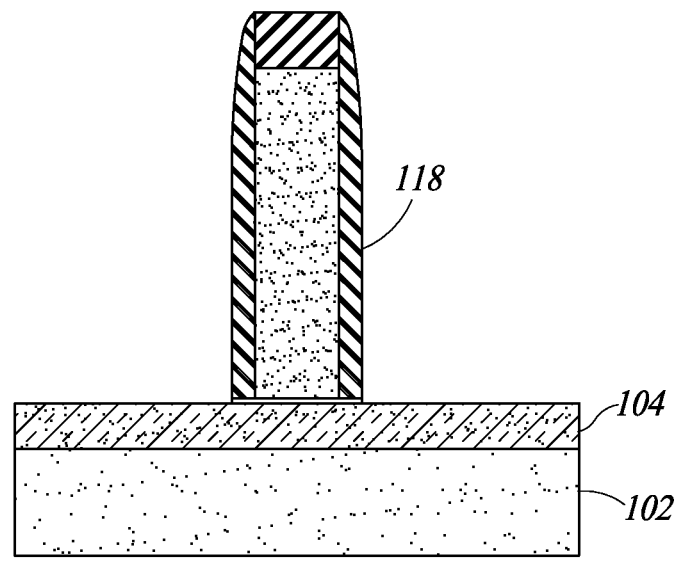
FIG. 6C is a cross-sectional view along a cut line Y-Y through the gate region of the hetero-channel FinFET shown in FIG. 6A.
Figure 6D:
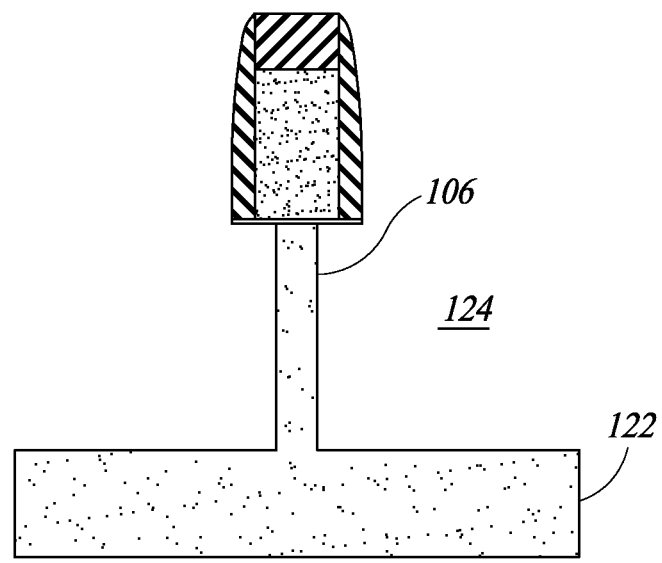
FIG. 6D is a cross-sectional view along a cut line Z-Z through the source, drain, and channel regions of the hetero-channel FinFET shown in FIG. 6A.

At 206, the fin 106 is recessed. The fin 106 is removed entirely in the source/drain regions and, in the gate region, side portions are removed by etching vertically. FIGS. 5A-5D illustrate partial recess of the fins 106 in the source/drain and channel regions, according to one embodiment. Recessing the fins 106 can be accomplished by reactive ion etching (RIE) of exposed silicon using an anisotropic etching chemistry that removes material preferentially in a downward direction. Such an anisotropic etch effectively removes the silicon fins in the regions 120 outside the gate structure 110, while preserving central portions of the fins 106 located directly underneath the gate structure 110. As shown in FIG. 5B, the height of the fins 106 is reduced by about half. No change is evident in FIG. 5C, along the cut line Y-Y.

At 208, the fin 106 is etched laterally to form recessed areas 124, undercutting the metal gate structure 110. FIGS. 6A-6D illustrate further recess of the fins 106 in the channel regions and complete recess of the fins 106 in the source/drain regions, according to one embodiment. The fins 106 can be recessed using, for example, an isotropic lateral etch process called "Frontier," available from Applied Materials, Inc. of Santa Clara, Calif. Alternatively, the lateral etch of the fins can be realized by the following: first, a SiGe layer from either a selective epitaxy process, or an amorphous deposition process, is formed on outer surfaces of the fins. Then, high temperature process is used to drive germanium substantially uniformly into the fins. Finally, SiGe can be etched away by a gas phase hydrochloric acid (HCl) process or by a hot SC1 wet clean process, as is well known in the art. Control of the lateral etch process is important so as to substantially undercut the gate structure 110, while maintaining sufficient support of the gate structure 110 by the remaining central portion of the fin 106. If there is too much undercut, making the recessed area 124 in the gate region too wide, the gate structure 110 can become unstable and collapse. However, if there is too little undercut, the benefit of the hetero-channel will be reduced.

Figure 7A:
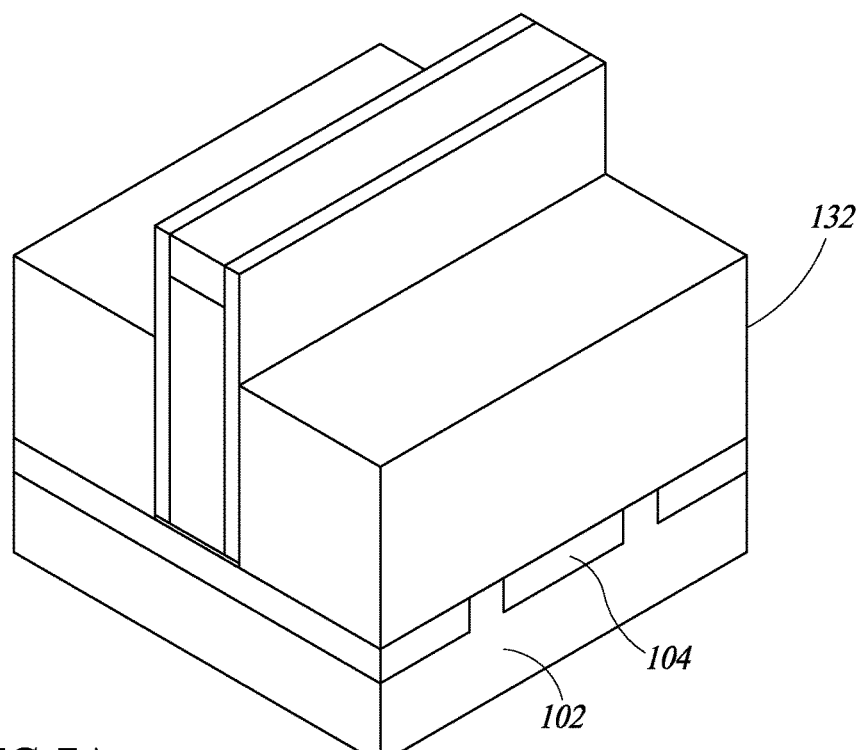
FIG. 7A is perspective plan view of a hetero-channel FinFET after forming the hetero-channel and a raised source and drain.
Figure 7B:
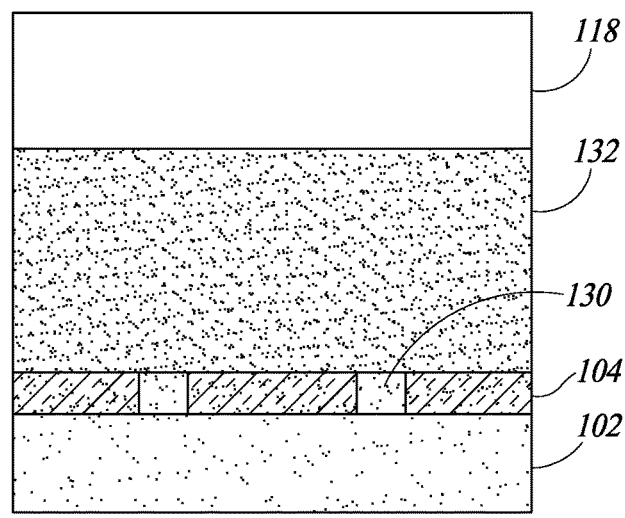
FIG. 7B is a cross-sectional view along a cut line X-X across the source/drain region of the hetero-channel FinFET of the hetero-channel FinFET shown in FIG. 7A.
Figure 7C:
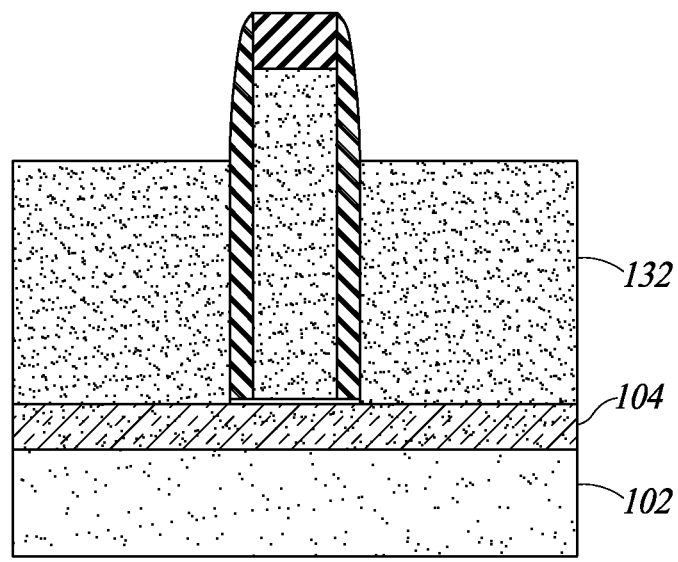
FIG. 7C is a cross-sectional view along a cut line Y-Y through the gate region of the hetero-channel FinFET shown in FIG. 7A.
Figure 7D:
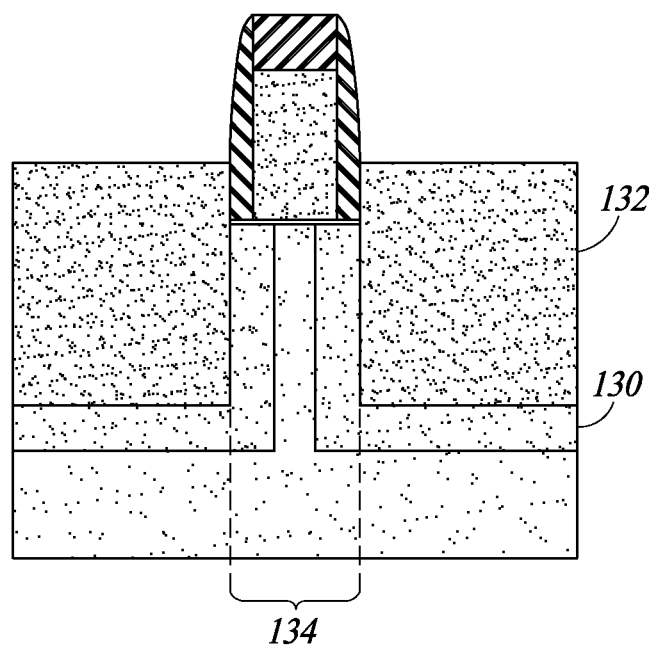
FIG. 7D is a cross-sectional view along a cut line Z-Z through the source, drain, and channel regions of the hetero-channel FinFET shown in FIG. 7A.

At 210, epitaxial SiGe is grown in the channel 134 adjacent to the silicon fin 106. FIGS. 7A-7D illustrate formation of the hetero-channel fin, according to one embodiment. First, a thin bottom layer 130 of un-doped SiGe is grown epitaxially from the silicon substrate 102. The un-doped SiGe bottom layer 130 is desirably about 5 nm thick. In FIG. 7B, the un-doped SiGe bottom layer 130 is shown at the bottom of the recessed area 124. In FIG. 7D, the un-doped SiGe bottom layer 130 is shown as an L-shaped layer that forms on the horizontal surface of the substrate 102. In addition, the un-doped SiGe bottom layer 130 grows out from the vertical surfaces of the silicon pillar, the fin 106, supporting the gate structure 110 to form a hetero-channel 134 having compressive strain. The hetero-channel 134 is a SiGe/Si/SiGe sandwich that facilitates current flow with reduced leakage from the channel to the source/drain regions. Such leakage currents are known to those skilled in the art as including, in particular, gate-induced drain leakage currents, or GIDL. Charge carriers flow through both the silicon and the SiGe of the strained hetero-channel, with greater mobility and less leakage than through a strained channel made of a single material. In one embodiment, the GIDL current density is less than about 100 pico-Amps/μm At 212, a thick, heavily doped SiGe top layer 132 is grown epitaxially from the un-doped SiGe bottom layer 130. The heavily doped SiGe top layer 132 contains a high concentration of germanium and a high concentration of boron to create raised source and drain regions for a high mobility pFET device. The high concentration of germanium atoms in the SiGe top layer 132, greater than about 25% germanium, allows the height of the fin to be taller than 40 nm and still maintain compressive strain. Otherwise, if the hetero-channel relaxes, defects can migrate into the relaxed film, thereby reducing the carrier mobility and causing the channel to be in a meta-stable state. A relaxed hetero-channel can only support a fin height less than about 35 nm.

In FIG. 7B, the heavily doped SiGe top layer 132 is shown as filling the rest of the recessed area 124, as well as forming a thick top layer of doped SiGe on top of the local oxide 104. In FIG. 7D, the heavily doped SiGe top layer 132 is shown as filling the L-shaped layers on either side of the hetero-channel. The heavily doped SiGe top layer 132 is desirably about 35 nm thick.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. Two adjacent transistors, comprising:
a silicon substrate;
a first raised source region having a first source bottom layer of un-doped epitaxial SiGe positioned above the substrate and a first source top layer of doped epitaxial SiGe that directly contacts and abuts the first source bottom layer, the first source top layer of the raised source region being thicker than the first source bottom layer and contiguous with the first source bottom layer;
a first raised drain region having a first drain bottom layer of un-doped epitaxial SiGe positioned above the substrate and a first drain top layer of doped epitaxial SiGe that directly contacts and abuts the first drain bottom layer, the first drain top layer of the raised drain region being thicker than the first drain bottom layer, and contiguous with the first drain bottom layer;
a first channel region fin extending out from the silicon substrate, the first channel region fin having a central first channel region made of silicon and side first channel regions made of un-doped SiGe, the first channel region fin providing a high-mobility current path that extends from the doped epitaxial SiGe of the first source top layer through the side first channel regions of un-doped SiGe to the first central channel region;
a second raised source region having a second source bottom layer of un-doped epitaxial SiGe positioned above the substrate and a second source top layer of doped epitaxial SiGe that directly contacts and abuts the second source bottom layer, the second source top layer of the raised source region being thicker than the second source bottom layer and contiguous with the second source bottom layer;
a second raised drain region having a second drain bottom layer of un-doped epitaxial SiGe positioned above the substrate and a second drain top layer of doped epitaxial SiGe that directly contacts and abuts the second drain bottom layer, the second drain top layer of the second raised drain region being thicker than the second drain bottom layer, and contiguous with the second drain bottom layer;
a second channel region fin extending out from the silicon substrate, the second channel region fin having a central second channel region made of silicon and side second channel regions made of un-doped SiGe, the second channel region fin providing a high-mobility current path that extends from the doped epitaxial SiGe of the second source top layer through the side second channel regions of un-doped SiGe to the second central channel region;
a first electrical isolation region positioned above the silicon substrate and abutting the first source bottom layer of un-doped epitaxial SiGe on a first side and the second source bottom layer of un-doped epitaxial SiGe on a second side;
a second electrical isolation region positioned above the silicon substrate and abutting the first drain bottom layer of un-doped epitaxial SiGe on a first side and the second drain bottom layer of un-doped epitaxial SiGe on a second side; and
a metal gate structure positioned between the raised source region and the raised drain region, the metal gate structure wrapping around three sides of the fin.

2. The two adjacent transistors of claim 1 wherein the SiGe in the side first channel regions is an un-doped epitaxial film.

3. The two adjacent transistors of claim 1 wherein the metal gate structure includes a metal gate, a gate dielectric, and sidewall spacers.

4. The two adjacent transistors of claim 1 wherein the first channel region fin is taller than 40 nm.

5. The two adjacent transistors of claim 1 wherein the SiGe in the side first channel regions contains at least 25% germanium.

6. The two adjacent transistors of claim 1 wherein the top layers of the raised source and drain regions are doped with positive ions to form a p-type material and the transistor is a PFET.

7. The two adjacent transistors of claim 6 wherein the positive ions are boron ions.

8. The two adjacent transistors of claim 1 wherein a width of the side first channel regions is in the range of about 4-10 nm.

9. The two adjacent transistors of claim 1 wherein the transistor is operable with a gate induced drain leakage (GIDL) current less than 100 pA/μm.

10. The two adjacent transistors of claim 1, wherein both the first channel region fin and the SiGe side first channel regions are configured to support current flow between the source and the drain.

11. A method of making a transistor, the method comprising:
    forming a silicon fin on a silicon substrate;
    forming a polysilicon gate over portions of the silicon fin to have some portions that are covered by the polysilicon gate and some portions that are not covered by the silicon fin;
    forming sidewall spacers on the polysilicon gate;
    etching the fin in a first etch to remove all portions of the fin that are not covered by the polysilicon gate;
    etching the fin in a second etch to remove portions of the fin that underlie and are covered by the polysilicon gate, the second etch being an undercut etch that etches fin portions that underlie the polysilicon gate and also a planar etch that removes portions of the fin that are not covered by the polysilicon gate;
    forming a source region using at least two separate steps, a first step including epitaxially growing a un-doped SiGe simultaneously on a side wall of the fin portion that are located under the polysilicon gate and also on the portions that are overlying the silicon substrate that are not under the polysilicon gate in a common growth sequence for both portions and a second step including epitaxially growing a heavily doped SiGe layer overlying the un-doped SiGe layer on those portions of the fin that not covered by the polysilicon gate to create a source region the having a source bottom layer of a first material of un-doped SiGe and a source top layer of a second material of doped SiGe, that directly contacts and abuts the source bottom layer, the source top layer being thicker than the source bottom layer and contiguous with the source bottom layer;
    forming a drain region simultaneously with the forming of the source region, using the same at least two separate steps, a first step including epitaxially growing a un-doped SiGe simultaneously on the side wall of the fin portion that are located under the polysilicon gate and also on the portions that are overlying the silicon substrate that are not under the polysilicon gate in a common growth sequence for both portions and a second step including epitaxially growing a heavily doped SiGe layer overlying the un-doped SiGe layer on those portions of the fin that not covered by the polysilicon gate to create a drain region the having a drain bottom layer of a first material and a drain top layer of a second material, that directly contacts and abuts the drain bottom layer, the drain top layer being thicker than the drain bottom layer and contiguous with the drain bottom layer;
    removing portions of the fin that extend beyond the gate into the source and drain regions;
    replacing side portions of the fin with an undoped epitaxial SiGe film; and
    growing a doped epitaxial Si film in the source and drain regions above the substrate.

12. The method of claim 11, further comprising replacing the polysilicon gate with a metal gate.

13. The method of claim 11 wherein replacing side portions of the fin with an epitaxial SiGe film introduces a compressive strain into the fin.

14. The method of claim 11 wherein replacing side portions of the fin includes:
    laterally recessing side portions of the fin underneath the gate to form substantially parallel recessed areas; and
    filling the recessed areas with the epitaxial SiGe film.

15. A transistor, comprising:
    a silicon substrate;
    a fin extending out from the silicon substrate, the fin including two different semiconductor materials that form a hetero-channel;
    a gate structure in contact with three sides of the fin, the gate structure including a gate oxide, a gate, and a sidewall spacer;
    an epitaxial raised source having a source bottom layer of a first material that is positioned above the silicon substrate and a source top layer of a second material, the source top layer being thicker than the source bottom layer and contiguous with the source bottom layer;
    an electrical isolation region positioned above the silicon substrate and abutting the source bottom layer;
    an epitaxial raised drain having a drain bottom layer of a first material that is positioned above the silicon substrate and a drain top layer of a second material, the drain top layer being thicker than the drain bottom layer and contiguous with the bottom layer;
    a source side channel region first layer that is directly abutting and contiguous both the source bottom layer and the source top layer, the source channel region first layer being composed of the first material; and
    a drain side channel region first layer that is directly abutting and contiguous both the drain bottom layer and the drain top layer, the drain side channel region first layer being composed of the first material.

16. The transistor of claim 15 wherein the fin has a height that exceeds 40 nm.

17. The transistor of claim 15 wherein the source and drain regions each include an un-doped bottom layer of SiGe and a heavily-doped top layer of SiGe.

18. A transistor comprising:
    a silicon substrate;
    a gate structure;
    a fin having a hetero-channel region located under, and at least partially surrounded by the gate structure;
    a raised source region positioned above the silicon substrate and extending from the fin adjacent to the hetero-channel region, the raised source region including a source bottom layer comprising un-doped monocrystalline SiGe material that is positioned above the silicon substrate and a source top layer comprising heavily-doped SiGe material that directly contacts and abuts the source bottom layer, the source top layer being contiguous with the source bottom layer and the source top layer being thicker than the source bottom layer;
    an electrical isolation region positioned above the silicon substrate and abutting the source bottom layer; and
    a raised drain region positioned above the silicon substrate and extending from the fin adjacent to the hetero-channel region, the raised drain region including a drain bottom layer comprising un-doped monocrystalline SiGe material positioned above the silicon substrate and a drain top layer comprising heavily-doped SiGe material that directly contacts and abuts the drain bottom layer, the drain top layer being contiguous with the drain bottom layer and the drain top layer being thicker than the drain bottom layer;
    wherein the hetero-channel region includes:
        a central silicon region,
        a first SiGe side region located between the central silicon region and the raised source region, the first SiGe side region being in abutting contact and contiguous with both the source bottom region and the source top region, and a second SiGe side region located between the central silicon region and the raised drain region, the second SiGe side region being in abutting contact and contiguous with both the drain bottom region and the drain top region.

19. The transistor of claim 18 wherein the central silicon region includes un-doped monocrystalline silicon material, wherein the first SiGe side region includes un-doped monocrystalline SiGe material, and wherein the second SiGe side region includes un-doped monocrystalline SiGe material.

20. The transistor of claim 18 comprising:
   a first L-shaped structure of un-doped monocrystalline SiGe material, the first L-shaped structure including
      a first upper leg formed by the first SiGe side region of the hetero-channel region, at least part of the first upper leg being located under the gate structure, and
      a first lower leg formed by the bottom layer of the source region; and
   a second L-shaped structure of un-doped monocrystalline SiGe material, the second L-shaped structure including
      a second upper leg formed by the second SiGe side region of the hetero-channel region, at least part of the second upper leg being located under the gate structure, and
      a second lower leg formed by the bottom layer of the drain region.

21. The two adjacent transistors of claim 1 wherein the electrical isolation region is composed of an oxide material.

* * * * *

UNITED STATES PATENT AND TRADEMARK OFFICE
CERTIFICATE OF CORRECTION

| | | |
|---|---|---|
| PATENT NO. | : 9,859,423 B2 | Page 1 of 1 |
| APPLICATION NO. | : 14/587655 | |
| DATED | : January 2, 2018 | |
| INVENTOR(S) | : Qing Liu et al. | |

It is certified that error appears in the above-identified patent and that said Letters Patent is hereby corrected as shown below:

In the Claims

Column 9, Line 30:
"fin that not covered by the polysilicon gate to create a" should read, --fin that are not covered by the polysilicon gate to create a--.

Column 9, Line 31:
"source region the having a source bottom layer of a first" should read, --source region having a source bottom layer of a first--.

Column 9, Line 46:
"those portions of the fin that not covered by the" should read, --those portions of the fin that are not covered by the--.

Column 9, Line 47:
"polysilicon gate to create a drain region the having a" should read, --polysilicon gate to create a drain region having a--.

Signed and Sealed this
Eleventh Day of June, 2019

Andrei Iancu
*Director of the United States Patent and Trademark Office*